US010777345B2

(12) United States Patent
Lassalle-Balier et al.

(10) Patent No.: US 10,777,345 B2
(45) Date of Patent: Sep. 15, 2020

(54) SPIN VALVE WITH BIAS ALIGNMENT

(71) Applicant: Allegro MicroSystems, LLC, Manchester, NH (US)

(72) Inventors: Rémy Lassalle-Balier, Bures sur Yvette (FR); Damien Dehu, La-Ville-du-Bois (FR)

(73) Assignee: Allegro MicroSystems, LLC, Manchester, NH (US)

( * ) Notice: Subject to any disclaimer, the term of this patent is extended or adjusted under 35 U.S.C. 154(b) by 118 days.

(21) Appl. No.: 15/901,301

(22) Filed: Feb. 21, 2018

(65) Prior Publication Data

US 2019/0259520 A1 Aug. 22, 2019

(51) Int. Cl.
*H01F 10/32* (2006.01)
*G01R 33/09* (2006.01)
*H01F 10/12* (2006.01)

(52) U.S. Cl.
CPC ....... *H01F 10/3268* (2013.01); *G01R 33/093* (2013.01); *H01F 10/3263* (2013.01); *H01F 10/123* (2013.01); *H01F 10/3272* (2013.01)

(58) Field of Classification Search
CPC ............. H01F 10/3268; H01F 10/3263; H01F 10/123; H01F 10/3272; G01R 33/093
USPC .................... 324/207.21, 252, 260
See application file for complete search history.

(56) References Cited

U.S. PATENT DOCUMENTS

| | | | | |
|---|---|---|---|---|
| 5,549,978 A * | 8/1996 | Iwasaki | ................. | B82Y 10/00 257/E43.004 |
| 6,178,071 B1 * | 1/2001 | Hasegawa | ............. | B82Y 10/00 360/324.11 |
| 6,181,534 B1 * | 1/2001 | Gill | ........................ | B82Y 10/00 360/324.11 |
| 6,252,750 B1 * | 6/2001 | Gill | ........................ | B82Y 10/00 360/324.11 |
| 6,317,298 B1 * | 11/2001 | Gill | ........................ | B82Y 10/00 360/324.11 |
| 6,338,899 B1 * | 1/2002 | Fukuzawa | .............. | B82Y 10/00 324/252 |

(Continued)

FOREIGN PATENT DOCUMENTS

JP 10021512 A * 1/1998
JP 11031312 A * 2/1999

(Continued)

OTHER PUBLICATIONS

Reig et al., Magnetic Field Sensors Based on Giant Magnetoresistance (GMR) Technology: Applications in Electrical Current Sensing, Sensors 2009, 9, 7919-7942; doi:10.3390/s91007919, (Year: 2009).*

(Continued)

*Primary Examiner* — Patrick Assouad
*Assistant Examiner* — Sean Curtis
(74) *Attorney, Agent, or Firm* — Daly, Crowley, Mofford & Durkee, LLP

(57) ABSTRACT

A magnetoresistance element (e.g. a spin valve) for detecting a changing magnetic field includes a pinning layer, pinned layer adjacent to the pinning layer, a spacer layer adjacent to the pinned layer, and a free layer adjacent to the spacer layer and arranged so that the spacer layer is between the pinned layer and the free layer. The pinned layer has a bias with a bias direction configured to reduce an effect of a static field on the detection of the changing magnetic field.

5 Claims, 7 Drawing Sheets

(56) References Cited

U.S. PATENT DOCUMENTS

| | | | | |
|---|---|---|---|---|
| 6,350,487 B1* | 2/2002 | Hasegawa | ............... | B82Y 10/00 324/207.21 |
| 6,636,391 B2* | 10/2003 | Watanabe | ............... | B82Y 10/00 360/321 |
| 6,656,604 B2* | 12/2003 | Hasewaga | ............... | B82Y 10/00 257/E43.004 |
| 6,714,444 B2* | 3/2004 | Huai | ...................... | B82Y 25/00 365/158 |
| 6,759,120 B2* | 7/2004 | Jongill | ................... | B82Y 10/00 257/E43.004 |
| 6,764,778 B2* | 7/2004 | Saito | ...................... | B82Y 10/00 360/324.12 |
| 6,838,740 B2* | 1/2005 | Huai | ...................... | B82Y 25/00 257/295 |
| 6,920,063 B2* | 7/2005 | Huai | ...................... | B82Y 25/00 365/158 |
| 6,952,328 B2* | 10/2005 | Hasegawa | ............... | B82Y 10/00 360/324.12 |
| 6,985,338 B2* | 1/2006 | Gill | ........................ | B82Y 10/00 360/324.12 |
| 7,008,702 B2* | 3/2006 | Fukuzawa | ............. | B82Y 10/00 360/324.12 |
| 7,106,624 B2* | 9/2006 | Huai | ...................... | B82Y 25/00 365/158 |
| 7,229,706 B2* | 6/2007 | Hasegawa | ............. | B82Y 10/00 360/324.11 |
| 7,242,556 B2* | 7/2007 | Gill | ........................ | B82Y 10/00 360/324.12 |
| 7,248,448 B2* | 7/2007 | Fukuzawa | ............. | B82Y 10/00 360/324.12 |
| 7,375,405 B2* | 5/2008 | Fukuzawa | ............. | B82Y 10/00 257/421 |
| 7,738,220 B1* | 6/2010 | Fukuzawa | ............. | B82Y 10/00 360/324.12 |
| 7,973,527 B2 | 7/2011 | Taylor et al. | | |
| 8,659,853 B2* | 2/2014 | Han | ...................... | B82Y 10/00 360/314 |
| 9,529,060 B2 | 12/2016 | Fermon et al. | | |
| 9,812,637 B2 | 11/2017 | Fermon et al. | | |
| 9,922,673 B2 | 3/2018 | Campiglio et al. | | |
| 2002/0048127 A1* | 4/2002 | Fukuzawa | ............... | H01L 43/10 360/324.1 |
| 2002/0048690 A1* | 4/2002 | Fukuzawa | ................ | G11B 5/66 428/811 |
| 2002/0054463 A1 | 5/2002 | Mukoyama et al. | | |
| 2003/0031894 A1 | 2/2003 | Lin et al. | | |
| 2003/0129454 A1* | 7/2003 | Suzuki | ................. | G01R 33/093 428/815 |
| 2003/0184918 A1 | 10/2003 | Lin et al. | | |
| 2004/0075959 A1* | 4/2004 | Gill | ...................... | G11B 5/3932 360/324.12 |
| 2004/0121185 A1* | 6/2004 | Fukuzawa | ........... | H01F 10/3272 428/815 |
| 2005/0030676 A1* | 2/2005 | Fukuzawa | ............. | G11B 5/3906 360/325 |
| 2005/0167770 A1* | 8/2005 | Fukuzawa | ............. | G11B 5/3906 257/421 |
| 2005/0280957 A1* | 12/2005 | Gill | ........................ | B82Y 25/00 360/324.12 |
| 2006/0072249 A1* | 4/2006 | Wakui | .................... | B82Y 25/00 360/324.1 |
| 2006/0152859 A1 | 7/2006 | Childress et al. | | |
| 2006/0267056 A1 | 11/2006 | Ju et al. | | |
| 2007/0063237 A1 | 3/2007 | Huai et al. | | |
| 2009/0237094 A1* | 9/2009 | Takahashi | ............ | G01R 33/093 324/693 |
| 2010/0327857 A1 | 12/2010 | Hoshiya et al. | | |
| 2011/0163739 A1 | 7/2011 | Ono et al. | | |
| 2012/0112741 A1 | 5/2012 | Meguro et al. | | |
| 2012/0225322 A1* | 9/2012 | Han | ...................... | B82Y 10/00 428/815 |
| 2016/0161574 A1 | 6/2016 | Zimmer | | |
| 2016/0359103 A1* | 12/2016 | Fermon | ................... | H01L 43/10 |
| 2018/0335484 A1 | 11/2018 | Campiglio et al. | | |
| 2018/0335486 A1 | 11/2018 | Lassalle-Balier et al. | | |
| 2019/0178954 A1 | 6/2019 | Lassalle-Balier et al. | | |
| 2019/0259520 A1* | 8/2019 | Lassalle-Balier | .... | G01R 33/093 |

FOREIGN PATENT DOCUMENTS

| | | |
|---|---|---|
| JP | 2010-080008 A | 4/2010 |
| TW | 2014-36316 A | 9/2014 |
| WO | WO 2005/020242 A2 | 3/2005 |

OTHER PUBLICATIONS

U.S. Appl. No. 15/837,511, filed Dec. 11, 2017, Lassalle-Balier et al.

Extended European Search Report dated Jun. 12, 2019 for European Application No. 19158585.0; 10 Pages.

Response (with Amended Claims) to European Extended European Search Report dated Jun. 12, 2019 for European Application No. 19158585.0; Response filed Jan. 7, 2020; 15 Pages.

Response to Office Action dated Jan. 13, 2020 for European Application No. 16728493.4; 13 pages.

U.S. Non-Final Office Action dated Apr. 14, 2017 for U.S. Appl. No. 15/165,322; 24 Pages.

Response to U.S. Non-Final Office Action dated Apr. 14, 2017 for U.S. Appl. No. 15/165,322; Response filed May 30, 2017; 23 Pages.

U.S. Notice of Allowance dated Jul. 14, 2017 for U.S. Appl. No. 15/165,322; 14 Pages.

PCT International Search Report and Written Opinion dated Aug. 10, 2016 for International Application No. PCT/US2016/034237; 21 Pages.

PCT International Preliminary Report dated Dec. 14, 2017 for International Application No. PCT/US2016/034237; 16 Pages.

European Rules 161/162 Communication dated Jan. 30, 2018 for European Application No. 16728493.4; 3 Pages.

Response to European Rules 161/162 Communication dated Jan. 30, 2018 for European Application No. 16728493.4; Response filed Aug. 8, 2018; 13 Pages.

European Examination Report dated Sep. 2, 2019 for European Application No. 16728493.4; 5 Pages.

Taiwan Examination Report (with English Translation) dated Feb. 16, 2017 for Taiwan Application No. 105117391; 19 Pages.

Response (with Amended English Claims) to Taiwan Examination Report dated Feb. 16, 2017 for Taiwan Application No. 105117391; Response filed Apr. 7, 2017; 19 Pages.

Japanese Office Action (with English Translation) dated Jun. 24, 2020 for Japanese Application No. 2017-563135; 5 pages.

Intention to Grant dated Jul. 21, 2020 for European Application No. 16728493.4; 7 pages.

* cited by examiner

SPIN VALVE WITH BIAS ALIGNMENT

FIELD

This disclosure relates to magnetoresistance elements and, more particularly, spin valves.

BACKGROUND

As known in the art, a spin valve is a device comprising two or more conducting magnetic materials generally arranged in layers. The electrical resistance through the device changes depending on the relative alignment of magnetism between the magnetic layers. The change in resistance is a result of the magnetoresistance effect.

The layers may be configured so that an external magnetic field can alter the direction of alignment of one (or more) of the layers, while the direction of alignment of the other layer remains constant. In other words, an external magnetic field can change the direction of relative magnetic alignment between the two layers, thus changing the resistance through the device.

In certain applications, a spin valve may operate within an environment that has an external, static magnetic field that can interfere with the spin valve's operation. The external, static field may alter the relative magnetic alignment between the layers causing undesirable changes in resistance.

SUMMARY

Magnetoresistance elements (e.g. spin valves) may be configured to compensate for interference caused by an external, static magnetic field.

In an embodiment, a magnetoresistance element for detecting a changing magnetic field includes a pinning layer, pinned layer adjacent to the pinning layer, a spacer layer adjacent to the pinned layer, and a free layer adjacent to the spacer layer and arranged so that the spacer layer is between the pinned layer and the free layer. The free layer has a bias direction configured to reduce an effect of a static field on the detection of the changing magnetic field.

In another embodiment, a magnetic field sensor includes at least one magnetoresistance element for detecting a changing magnetic field, the magnetoresistance element comprising a pinning layer, a pinned layer, a spacer layer adjacent to the pinned layer, and a free layer adjacent to the spacer layer and arranged so that the spacer layer is between the pinned layer and the free layer. The free layer has a bias direction configured to reduce an effect of a static field on the detection of the changing magnetic field.

In another embodiment, a magnetoresistance element for detecting a changing magnetic field includes a pinning layer, a pinned layer, a spacer layer adjacent to the pinned layer, and a free layer adjacent to the spacer layer and arranged so that the spacer layer is between the pinned layer and the free layer. The magnetoresistance element comprises a magnetic bias to counteract an effect of a static field.

In another embodiment, a magnetoresistance element for detecting a changing magnetic field includes a pinning layer, a pinned layer, a spacer layer, a free layer, and means for counteracting an effect of a static field.

BRIEF DESCRIPTION OF THE DRAWINGS

The drawings aid in explaining and understanding the disclosed technology. Since it is often impractical or impossible to illustrate and describe every possible embodiment, the figures depict one or more example embodiments. Accordingly, the figures are not intended to limit the scope of the invention—other embodiments may fall within the scope of the disclosure and claims. Like numbers in the figures denote like elements.

DETAILED DESCRIPTION

Figures 1, 2:
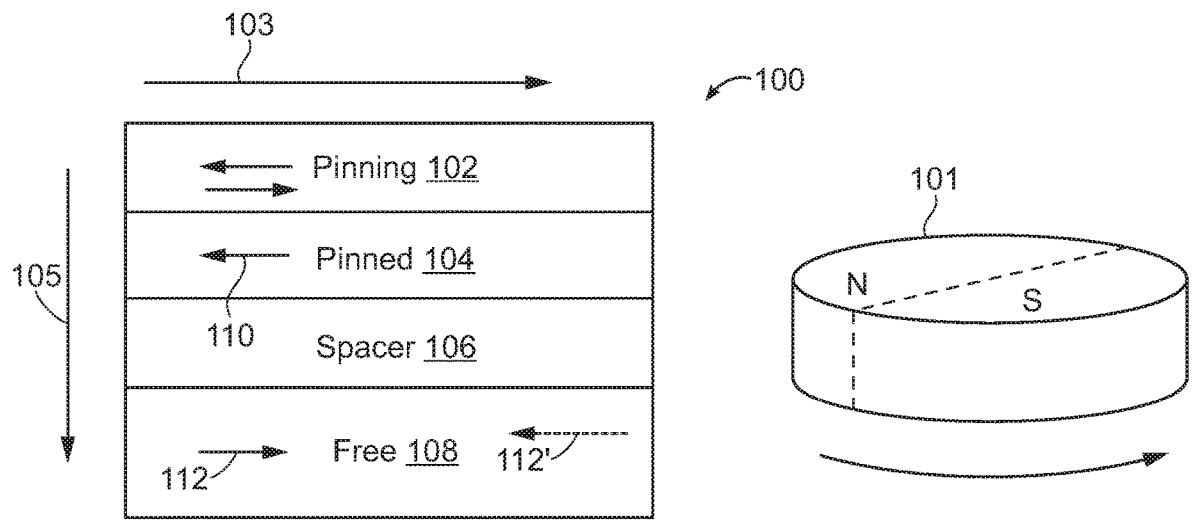
FIG. 1 is a cross-sectional diagram of a simple spin valve.
FIG. 2 is a cross-sectional diagram of the spin valve of FIG. 1.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. Certain magnetoresistance elements may be configured to act as spin valves. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). This disclosure relates to magnetoresistance elements.

As is known, some magnetic field sensing elements tend to have an axis of maximum sensitivity parallel to a substrate that supports the magnetic field sensing element, and others tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin valves) and vertical Hall elements tend to have axes of sensitivity parallel to a substrate.

The term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "target" and "magnetic target" are used to describe an object to be sensed or detected by a magnetic field sensor or magnetic field sensing element.

FIG. 1 is a cross-sectional diagram of a simple spin valve 100. Spin valve 100 includes a pinning layer 102, a pinned layer 104, a spacer layer 106, and a free layer 108. When used within a circuit, current 103 may flow through the layers of spin valve 100. In other embodiments, and with other types of GMR elements, current may flow in a direction of arrow 105. Also, if the spin valve is a TMR type magnetoresistor, current may flow through the spin valve in the direction of arrow 105. The presence (and direction) of an external magnetic field can change the electrical resistance of spin valve 100 by changing the relative magnetic alignment of pinned layer 104 and free layer 108.

Pinning layer may be an antiferromagnetic layer placed adjacent to pinned layer 104. Pinned layer 104 is a magnetic layer having a magnetic alignment indicated by arrow 110. The presence of pinning layer 102 adjacent to pinned layer 104 acts to maintain the direction magnetic alignment of pinned layer 104 so that the direction does not change in the presence of an external magnetic field.

A conductive spacer layer 106 is placed between free layer 108 and pinned layer 104 to create distance between free layer 108 and the other layers. Free layer 108 may be a conductive, magnetic layer that has a direction of magnetic alignment shown by arrow 112. In the presence of an external magnetic field, the direction of magnetic alignment of free layer 108 may change, as shown by dotted arrow 112', for example.

As the direction of magnetic alignment 112 of free layer 108 changes, the electrical resistance through spin valve 100 will change. In an embodiment, if the directions of magnetic alignment of pinned layer 104 and free layer 108 are the same, the electrical resistance of spin valve 100 may be a minimal value for the device and, if the directions of magnetic alignment are opposite or misaligned, the electrical resistance of spin valve 100 may be a maximum value for the device.

Spin valve 100 may be used to detect magnetic fields, such as a magnetic field produced by magnetic target 101. As magnetic target 101 rotates, the magnetic field produced by target 101 may re-align the magnetic alignment of free layer 108, for example changing the direction of alignment from direction 112 to direction 112'. As the magnetic alignment of free layer 108 changes, electrical resistance through spin valve 100 will also change. In other embodiments, spin valve 100 may be used to detect magnetic fields produced by other sources such as coils, magnetic fields produced by eddy currents induced in a conductive target, etc.

FIG. 2 is another example of a cross-sectional view of spin valve 100. In an embodiment, pinning layer 102 may comprise a layer of platinum manganese (PtMn) having a thickness of about 15-30 nm. Pinned layers 104 may comprise sublayer 202 of cobalt iron (CoFe) having a thickness of about 2.0 nm, a sublayer 204 of ruthenium (Ru) having a thickness of about 0.85 nm, and a sublayer 206 of CoFe having a thickness of about 2.1 nm. In embodiments, the magnetic alignment of sublayers 202 and 206 may be misaligned and/or opposite.

Spacer layer 106 may comprise a layer of Copper (Cu) having a thickness of about 2.4 nm.

Free layer 108 may comprise a sublayer of CoFe having a thickness of about 1.0 nm and a sublayer 210 of nickel iron (NiFe) having a thickness of about 5.0 nm.

Figures 3, 4:
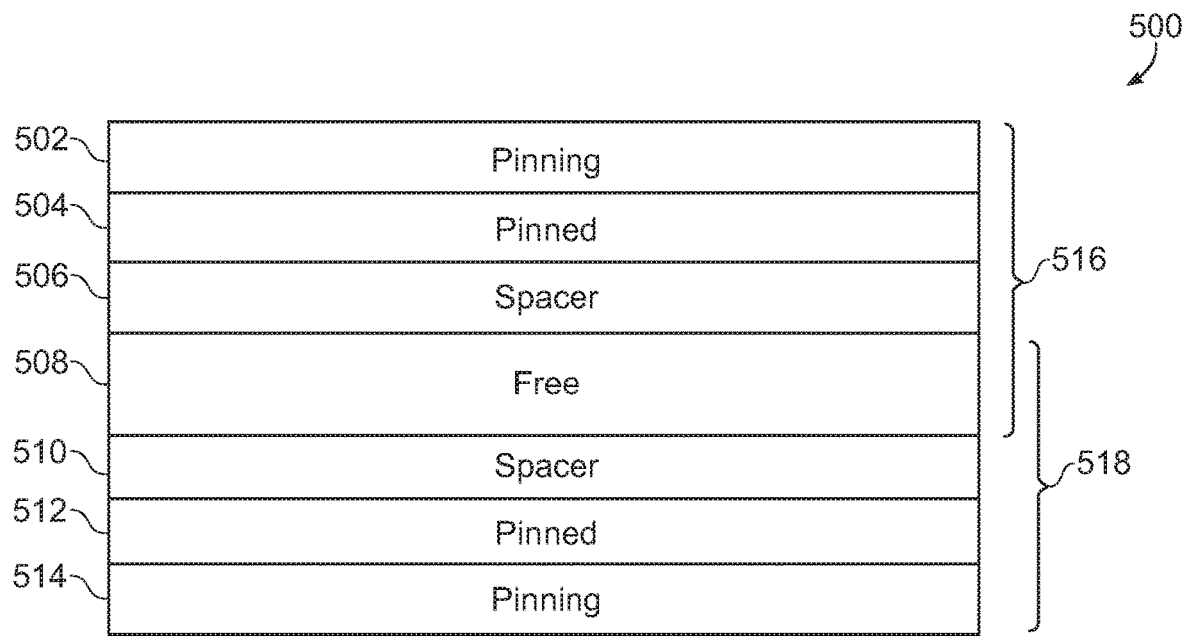
FIG. 3 is a cross-sectional diagram of a double-pinned spin valve.
FIG. 4 is a cross-sectional diagram of the double-pinned spin valve of FIG. 3.

FIG. 3 is a cross-sectional view of a so-called double-pinned spin valve 500. Double pinned spin valve 500 includes a first portion having a pinning layer 502, a pinned layer 504, a first spacer layer 506, a free layer 508; and a second portion having the free layer 508, a second spacer layer 510, a second pinned layer 512, and a second pinning layer 514 504, a first spacer layer 506, a free layer 508; and a second portion having the free layer 508, a second spacer layer 510, a second pinned layer 512, and a second pinning layer 514.

In embodiments, pinning layer 502 acts to maintain, or "pin," the magnetic alignment of pinned layer 504. Similarly, pinning layer 514 pins the magnetic alignment of pinned layer 512. The magnetic alignment of free layer 508 is biased by RKKY coupling with 512 through 510 and may change in the presence of external magnetic fields. As the magnetic alignment of free layer 508 changes to become aligned with, or misaligned with, pinned layer 504, the electrical resistance of double-pinned spin valve 500 will change. In embodiments, sensitivity of the double-pinned spin valve may be tuned or adjusted by changing the thickness of Ru layer 510 and/or my changing the type of material used for layer 510, hence changing the bias on the free layer 508.

In embodiments, the base resistance (e.g. the resistance when no external magnetic field is applied) of double-pinned spin valve 500 is a function of the magnetic alignment of pinned layer 504 and the bias on the free layer 508.

FIG. 4 is another example of a cross-sectional view of double-pinned spin valve 500. Pinning layer 502 may comprise a layer of PtMn about 15-30 nm thick. Pinned layer 504 may comprise a layer of CoFe about 2.0 nm thick, a layer of Ru about 0.85 nm thick, and another layer of CoFe about 2.1 nm thick. Spacer layer 506 may comprise a layer of Cu about 2.4 nm thick. Free layer 508 may comprise a layer of CoFe about 1.0 nm thick and a layer of NiFe about 5.0 nm thick. Spacer layer 510 may comprise a layer of Ru about 0.1 to about 4.0 nm thick. Pinned layer 512 may comprise a layer of CoFe about 2.1 nm thick, a layer of Ru about 0.85 nm thick, and another layer of CoFe about 2.0 nm thick. Pinning layer 514 may comprise a layer of PtMn or a layer of iridium manganese (IrMn) about 5.0 to 15.0 nm thick.

In embodiments, when double-pinned spin valve 500 is not exposed to an external magnetic field, the free layer of the double-pinned spin valve 500 may have a magnetic bias, which can be represented by a magnetic field vector. The magnetic bias results from RKKY coupling between free layer 508 and pinned layer 512 through Ru layer 510. For example, the direction of magnetic alignment of pinned layer 512 may be configured so that they create a desired magnetic bias.

In embodiments, a bias is applied on the free layer 508. Specifically, the bias may be applied to the NiFe layer of the free layer 508. The CoFe and NiFe layers of the free layer 508 being in contact with either other, they may be very strongly coupled one to another so that the bias on the NiFe is effective also on the CoFe layer.

The bias may be obtained by coupling the free layer to the pinned structure 512 (e.g. the top-most layer of the pinned structure 512). This coupling may be achieved using Ruderman-Kittel-Kasuya-Yoshida (RKKY) coupling through the Ru layer 510. In this arrangement, the magnetic direction of pinned structure 512 may not move in response to an external magnetic field (e.g. the magnetic direction may not move in the presence of a magnetic field of about 1 kOe or less). Pinned structure 512 may act as an anchor for free layer The strength of the coupling may be defined by the thickness and/or material of the Ru layer.

The coupling through Ru is not necessarily ferromagnetic. For example, both layers may have the same direction of magnetization. It may, for example, be antiferromagnetic depending on the thickness of the Ru layer. In embodiments, the thickness of the Ru layer may be chosen to achieve the desired ferromagnetic or antiferromagnetic coupling.

In embodiments, double-pinned spin valve 500 may be biased so that, in the presence of an external static field, double-pinned spin valve will act and respond like a simple spin valve that is not affected by an external static field.

Figure 5:
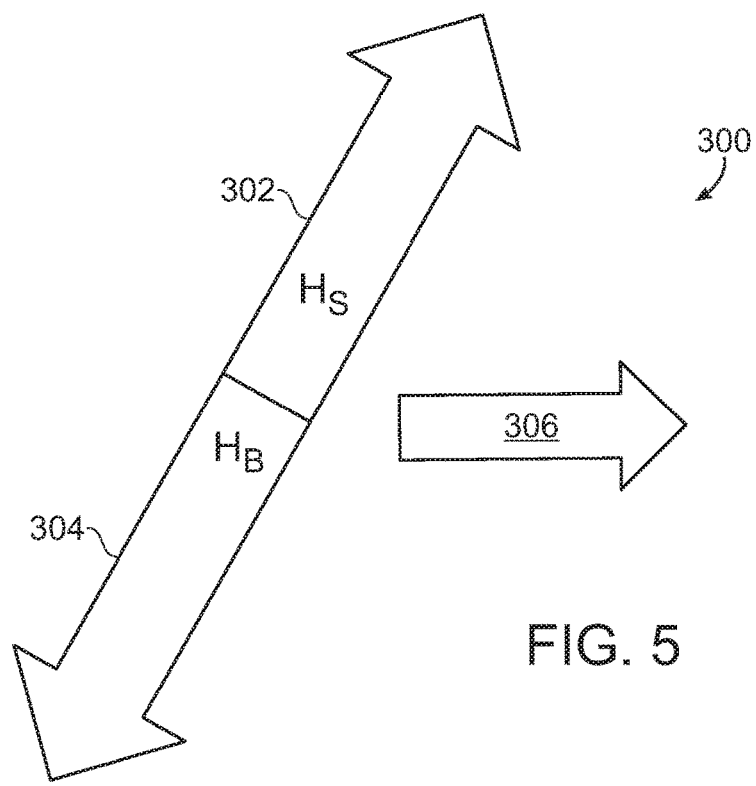
FIG. 5 is a magnetic field vector diagram associated with the spin valve of FIG. 1.

Referring to FIG. 5, a vector diagram 300 illustrates magnetic bias associated with double-pinned spin valve 500 for a particular application. Vector 302 may represent an external, static magnetic field. For example, if spin valve 100 is installed in an automotive power steering system, vector 302 may represent an ambient magnetic field that is present in the system due to external magnetic sources. Vector 306 is a reference vector that represents the axis of maximum sensitivity of spin valve 500. This magnetic field may be generated by, for example, a magnetic target or a back-bias magnetic source. However, if magnetic vector 302 is present in the system, it may interfere with spin valve 500's ability to detect an external magnetic field. In embodiments, magnetic vector 302 may alter the alignment of free layer 108 and, potentially, increase or decrease the resistance of spin valve 500. This can reduce the spin valve's sensitivity to detect the external magnetic field. To counter the effect of static magnetic field vector 302, spin valve 500 may be configured to have a magnetic bias shown by magnetic bias vector 304. Magnetic bias vector 304 may be opposite in amplitude and direction to static magnetic field vector 302 to (at least locally) cancel out the effect of static magnetic field vector 302 on spin valve 100.

In embodiments, the direction and magnitude of static field vector 306 may be known prior to applying the magnetic bias to spin valve 500. For example, if it is known that spin valve 100 will be operating in an environment where static magnetic field vector 302 is present, then spin valve 500 may be formed to have an intrinsic bias vector 304 to counter the effects of static magnetic field vector 302.

Figure 6:
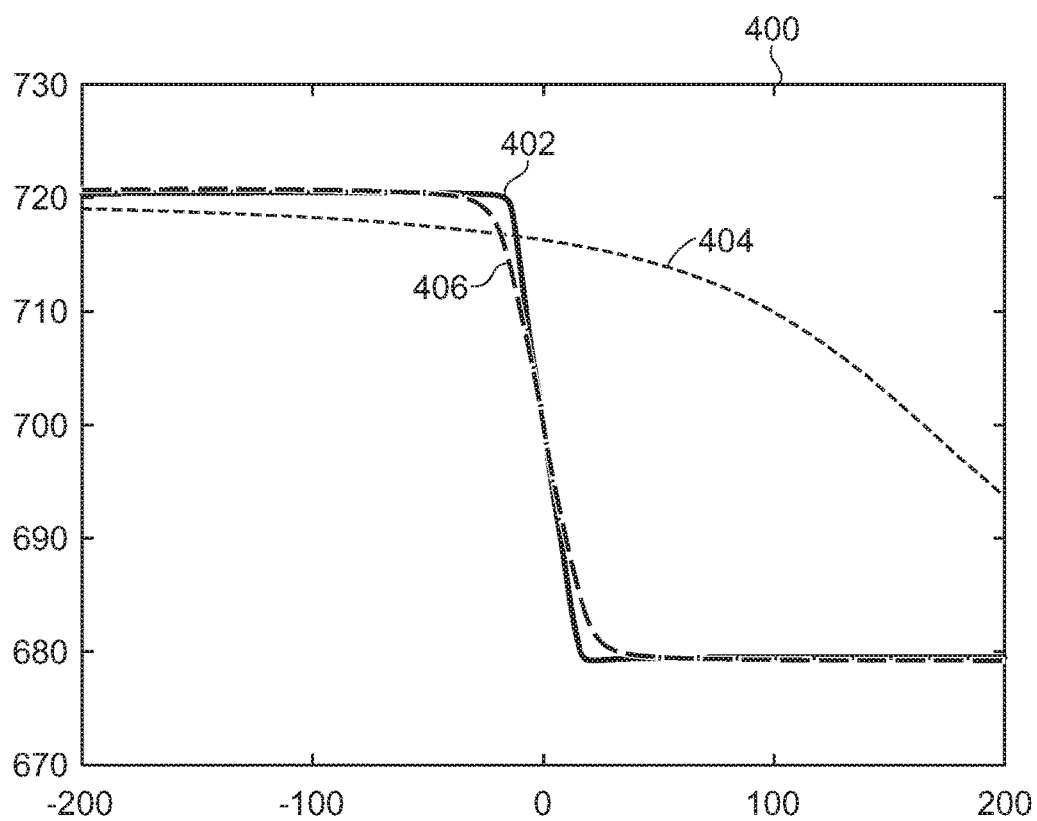
FIG. 6 is a graph of simple spin valve resistance.

Referring to FIG. 6, graph 400 illustrates sensitivity of spin valves in various arrangements. The horizontal axis of graph 400 represents magnetic field strength of a reference field in the direction of magnetic vector 306, i.e. the magnetic field to be measured by the spin valve. The vertical axis represents resistance of the spin valve.

Curve 402 illustrates the resistive reaction of a simple spin valve (e.g. a spin valve without a bias) operating in an environment without an external static field. Curve 402 is a close-to-ideal reaction. When the magnetic field is opposite to the reference, the resistance of the spin valve is high—720 Ohms in this example. When the magnetic field is along the reference, the resistance of the spin valve is low—680 Ohms in this example.

Curve 404 illustrates the resistive reaction of a simple spin valve operating in an environment where an external, static field (e.g. the static field represented by magnetic vector 302) is present. In this example, the external, static field interferes with the spin valve's ability to detect the applied magnetic field to sense. When the applied magnetic field to sense changes polarity, there is little change in the resistance of the spin valve.

Curve 406 illustrates the resistive reaction of a double pinned spin valve (e.g. spin valve 500) operating in the presence of an external, static field. In this case, the intrinsic bias (i.e. the bias represented by magnetic bias vector 304) of spin valve 500 cancels the effect of the external, static field. This effect may be represented by the equation $H_S+H_B=0$, where $H_S$ is the external, static field vector 302 and $H_B$ is the bias field vector 304 of spin valve 100. As shown, the performance curve 406 of spin valve 500 with a magnetic bias vector 304 operating in an environment with an external, static field vector 302 approximates the performance curve 402 of a simple spin valve operating in an environment without an external, static field.

Figure 7:
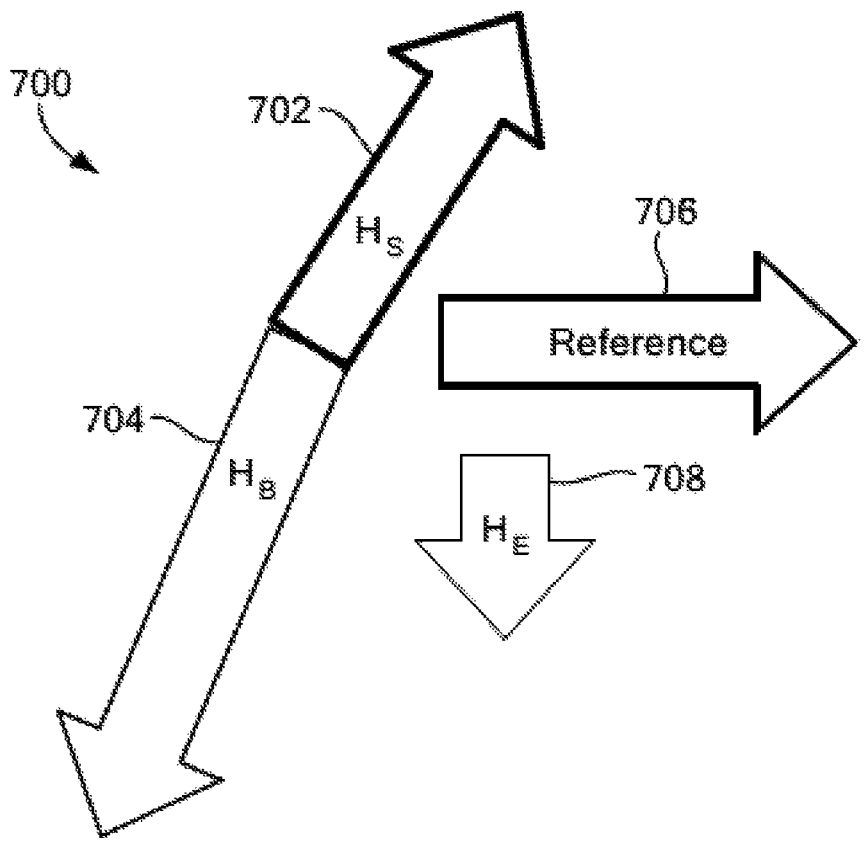
FIG. 7 is a magnetic field vector diagram associated with the double-pinned spin valve of FIG. 3.

Referring to FIG. 7, a vector diagram 700 illustrates magnetic bias associated with double-pinned spin valve 500 for another particular application. Vector 702 may represent an external, static magnetic field. For example, if double-pinned spin valve 500 is installed in an automotive power steering system, vector 702 may represent an ambient magnetic field that is present in the system due to external magnetic sources. Vector 706 is a reference vector that represents the axis of maximum sensitivity of the spin valve. However, if magnetic vector 702 is present in the system, it may interfere with double-pinned spin valve 500's ability to detect a magnetic field. Thus, double-pinned spin valve 500 may be configured to have a magnetic bias shown by magnetic vector 704.

In embodiments, it may be desirable to create a magnetic bias for the overall system shown by system bias vector 708. Thus, double-pinned spin valve 500 may be configured to have a magnetic bias vector 704 which, when added to static field vector 702, results in system bias vector 708. Magnetic bias vector 704 may be configured so that $H_B+H_S=H_E$, where $H_B$ is the magnetic bias vector 704 of double-pinned spin valve 500, $H_S$ is the static magnetic field vector 702, and $H_E$ is the system bias vector 708.

Figure 8:
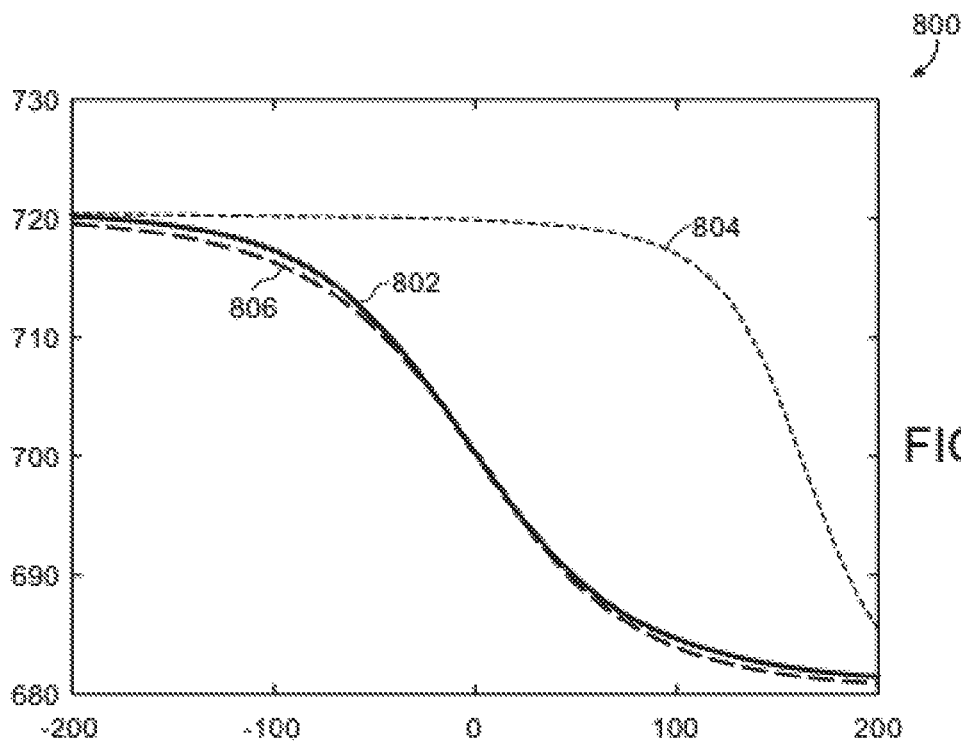
FIG. 8 is a graph of double-pinned spin valve resistance.

Referring to FIG. 8, graph 800 illustrates sensitivity of double-pinned spin valves in various arrangements. The horizontal axis of graph 800 represents magnetic field strength of an applied magnetic field, i.e. the magnetic field to be measured by the spin valve. The vertical axis represents resistance of the double-pinned spin valve.

Curve 802 illustrates the resistive reaction of a double-pinned spin valve with an intrinsic magnetic bias 708 operating in an environment without an external static field. Curve 802 is a close-to-ideal resistive reaction. When the magnetic field is opposite to the reference, the resistance of the spin valve is high—720 Ohms in this example. When the magnetic field is parallel to the reference, the resistance of the spin valve is low—680 Ohms in this example.

Curve 804 illustrates the resistive reaction of a double-pinned spin valve operating with a bias 708 in an environment where an external, static field (e.g. the static field represented by magnetic vector 702) is present. In this example, the external, static field interferes with the double-pinned spin valve's ability to detect the reference field. When the reference field changes polarity at point 0 on the horizontal axis, there is little change in the resistance of the double-pinned spin valve.

Curve 806 illustrates the resistive reaction of a biased double-pinned spin valve (e.g. double-pinned spin valve 500) operating in the presence of an external, static field. In this case, the intrinsic magnetic bias of double-pinned spin valve 500 added to the external static field results in a desired system bias $H_E$. In embodiments, system bias $H_E$ may be desirable for various reasons including, but not limited to: tuning the sensitivity of double-pinned spin valve 500, tuning a magnetic offset of double-pinned spin valve 500, and/or tuning Barkhausen noise of the system.

As shown, the resistance curve 806 of double-pinned spin valve 500 with a magnetic bias magnetic vector 704 operating in an environment with an external, static field vector 702 approximates the performance curve 802 of a double-pinned spin valve with bias 708 operating in an environment without an external, static field.

Figure 9:
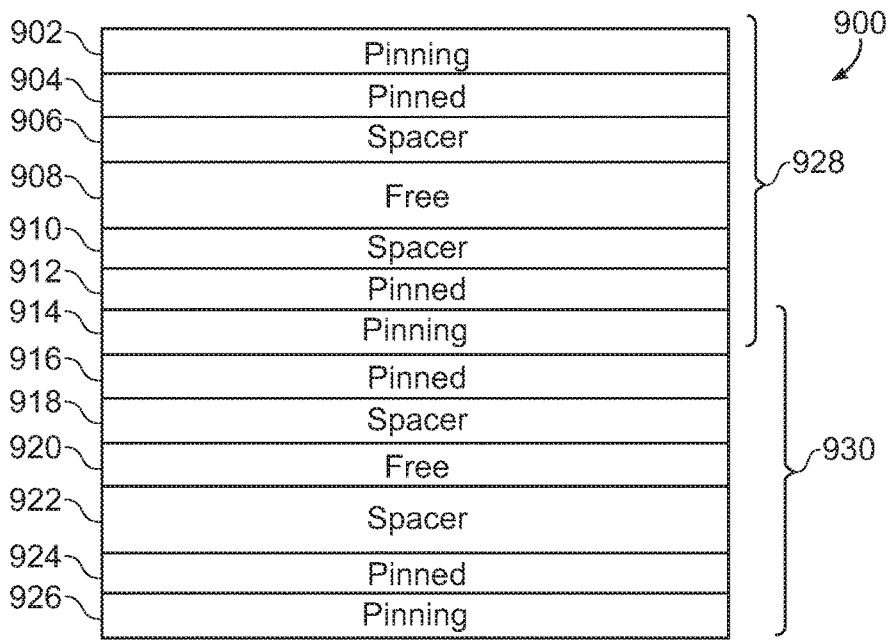
FIG. 9 is a cross-sectional diagram of a double spin valve.

FIG. 9 is a cross-sectional view of a so-called double spin valve 900. Double spin valve 900 includes a pinning layer 902, a pinned layer 904, a spacer layer 906, a free layer 908, a coupling spacer layer 910, a pinned layer 912, a pinning layer 914, a pinned layer 916, a spacer layer 918, a free layer 920, a coupling spacer layer 922, a pinned layer 924, and a pinning layer 926. In an embodiment, double spin valve may be viewed as a double-pinned spin valve 928 (similar to double-pinned spin valve 500 shown in FIG. 3) placed back to back with another double-pinned spin valve 930, where double-pinned spin valves 928 and 930 share pinning layer 914.

In embodiments, pinning layer 902 acts to maintain, or "pin," the magnetic alignment of pinned layer 904. Similarly, pinning layer 926 pins the magnetic alignment of pinned layer 924. Shared pinning layer 914 pins the magnetic alignment of pinned layer 912 and pinned layer 916. The magnetic alignment of free layers 908 and 920 is affected by the biases from 904 and 924 and may change in the presence of external magnetic fields. As the magnetic alignments of free layer 908 and 920 change to become aligned with, or misaligned with, pinned layers 904, 914, 916, and/or 924, the electrical resistance of double-pinned spin valve 500 will change.

In embodiments, the base resistance of double spin valve 900 (e.g. the resistance of double spin valve 900 in the absence of an external magnetic field) may be a function of the magnetic alignment of pinned layers 914, 916, and biases 908, 920. Also, the resistance of spin valve 900 is a function of the relative alignments of layers 904, 908, 920, and/or 924.

Figure 10:
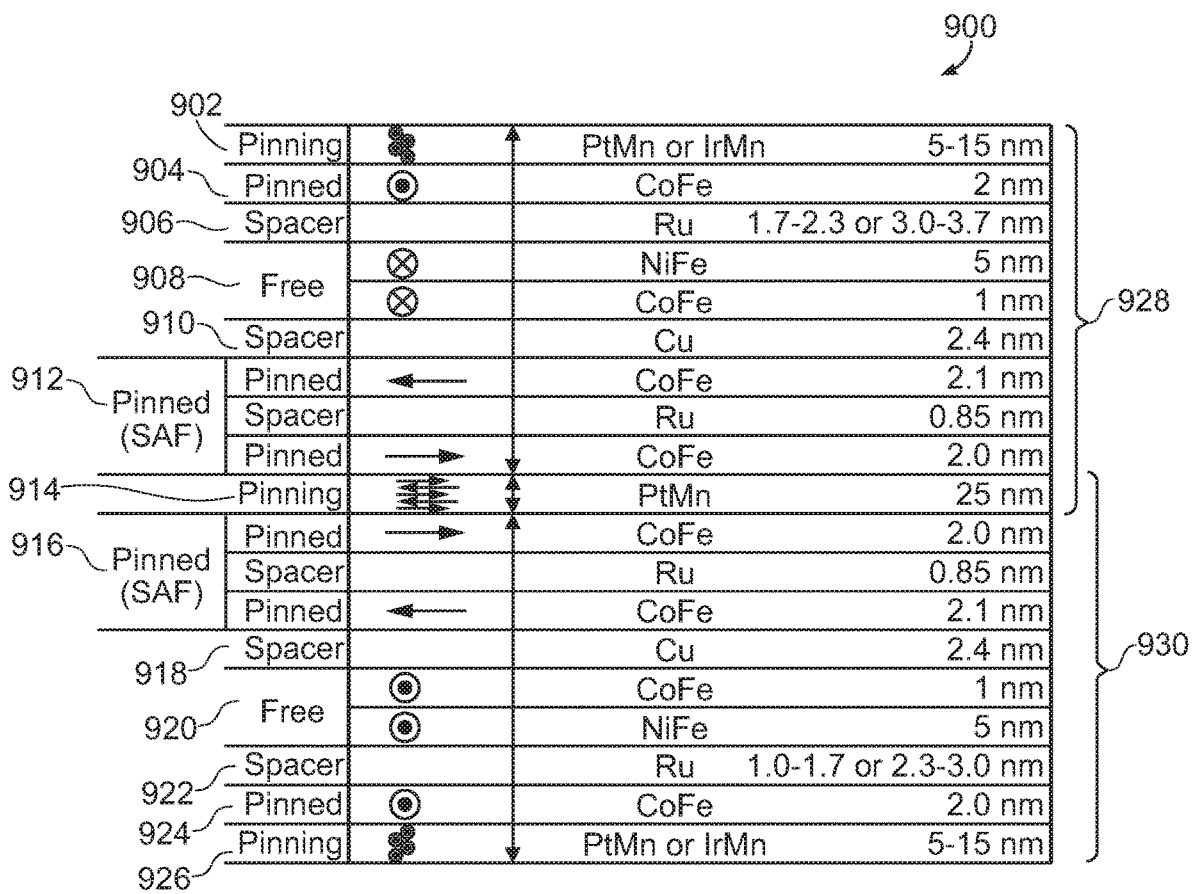
FIG. 10 is a cross-sectional diagram of the double spin valve of FIG. 9.

FIG. 10 is another example of a cross-sectional view of double spin valve 900. Pinning layer 902 may comprise a layer of PtMn or IrMn about 5-15 nm thick. Pinned layer 904 may comprise a layer of CoFe about 2.0 nm thick. Coupling spacer layer 906 may comprise a layer of Ru about 1.7-3.8 nm thick. Free layer 908 may comprise a layer of CoFe about 1.0 nm thick and a layer of NiFe about 5.0 nm thick. Spacer layer 910 may comprise a layer of Cu about 2.4 nm thick. Pinned layer 912 may comprise a layer of CoFe about 2.1 nm thick, a layer of Ru about 0.85 nm thick, and another layer of CoFe about 2.0 nm thick. Pinning layer 914 may comprise a layer of PtMn about 25 nm thick. Pinned layer 916 may comprise a layer of CoFe about 2.0 nm thick, a layer of Ru about 0.85 nm thick, and another layer of CoFe about 2.1 nm thick. Spacer layer 918 may comprise a layer of Cu about 2.4 nm thick. Free layer 920 may comprise a layer of CoFe about 1.0 nm thick and a layer of NiFe about 5.0 nm thick. Coupling spacer layer 922 may comprise a layer of Ru about 1.0-3.0 nm thick. Pinned layer 924 may comprise a layer of CoFe about 2.0 nm thick. And pinning layer 926 may comprise a layer of PtMn or IrMn about 5-15 nm thick.

In embodiments, when double spin valve 900 is not exposed to an external magnetic field, double spin valve 900 may have a magnetic bias for each spin valve, which can be represented by two magnetic field vectors. The magnetic bias results from the RKKY coupling through 906 and 922. For example, the direction of magnetic alignment of biased layers 904, and/or 924 may be configured so that they create a desired magnetic bias.

Figure 11:
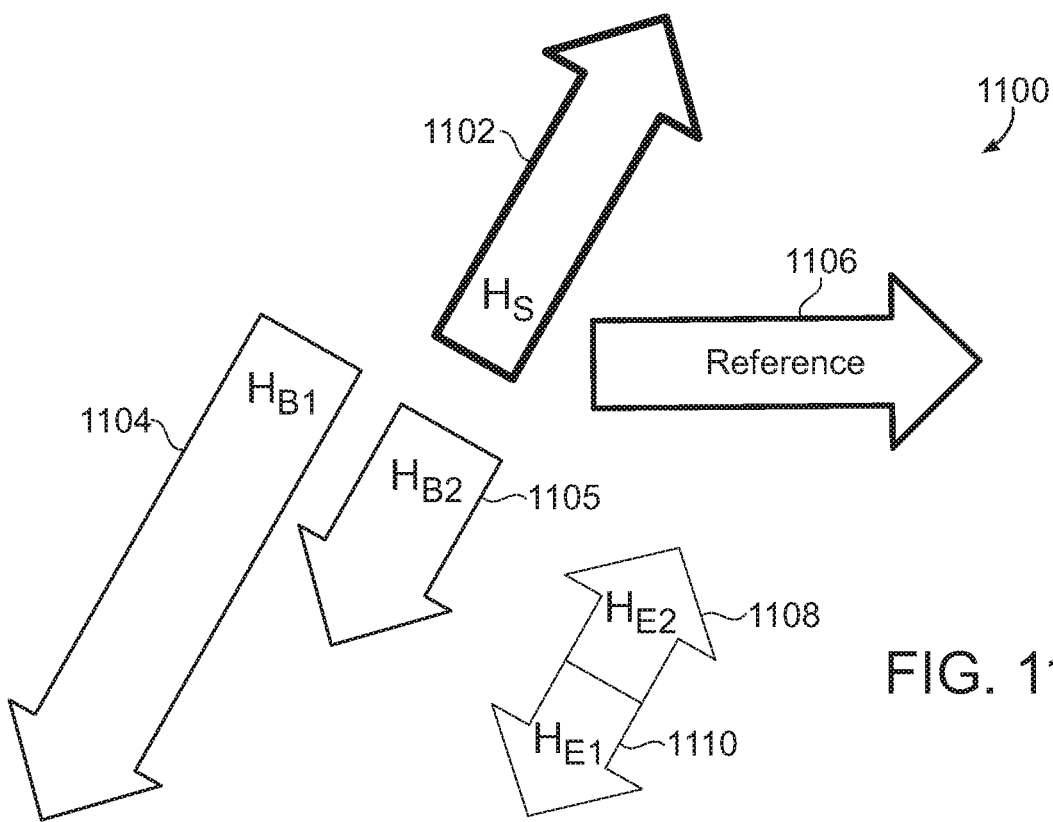
FIG. 11 is a magnetic field vector diagram associated with the double spin valve of FIG. 9.

Referring to FIG. 11, a vector diagram 1100 illustrates magnetic bias associated with double spin valve 900 for a particular application. Vector 1102 may represent an external, static magnetic field. For example, if double spin valve 900 is installed in an automotive power steering system, vector 1102 may represent an ambient magnetic field that is present in the system due to external magnetic sources. Vector 1106 is a reference vector that represents the axis of maximum sensitivity of double spin valve 900. However, if magnetic vector 1102 is present in the system, it may interfere with the ability of double spin valve 1100 to detect an external magnet field. Thus, double spin valve 900 may be configured to have two magnetic biases shown by magnetic vectors 1104 and 1105.

Each double-pinned spin valve 928 and 930 of double spin valve 900 (see FIG. 10) may be configured to produce its own magnetic bias vector. In an embodiment, magnetic bias vector 1104 may be associated with double-pinned spin valve 928 and magnetic vector 1105 may be associated with double-pinned spin valve 930, or vice versa.

In embodiments, it may be desirable for each double-pinned spin valve 928 and 930 to produce an overall system bias vector as shown by bias vectors 1108 and 1110. Thus, double-pinned spin valve 928 may be configured to have a magnetic bias vector 1104 which, when added to static field vector 1102, results in system bias vector 1110. Magnetic bias vector 1104 may be configured so that $H_B1 + H_S = H_{E1}$, where $H_{B1}$ is the magnetic bias vector 1104 of double-pinned spin valve 928, $H_S$ is the static magnetic field vector 1102, and $H_{E1}$ is the system bias vector 1110.

Similarly, double-pinned spin valve 930 may be configured to have a magnetic bias vector 1105 which, when added to static field vector 1102, results in system bias vector 1108. Magnetic bias vector 1105 may be configured so that $H_{B2} + H_S = H_{E2}$, where $H_{B2}$ is the magnetic bias vector 1105 of double-pinned spin valve 930, $H_S$ is the static magnetic field vector 1102, and $H_{E2}$ is the system bias vector 1108.

In embodiments, the bias vectors may be configured so that the system bias vectors 1108 and 1110 have substantially equal amplitudes and substantially opposite directions to cancel each other out. In other words, so that $H_{E1} + H_{E2} = 0$. In other embodiments, $H_{E1}$ and $H_{E2}$ may have different directions and magnitudes so they do not cancel each other out.

Figure 12:
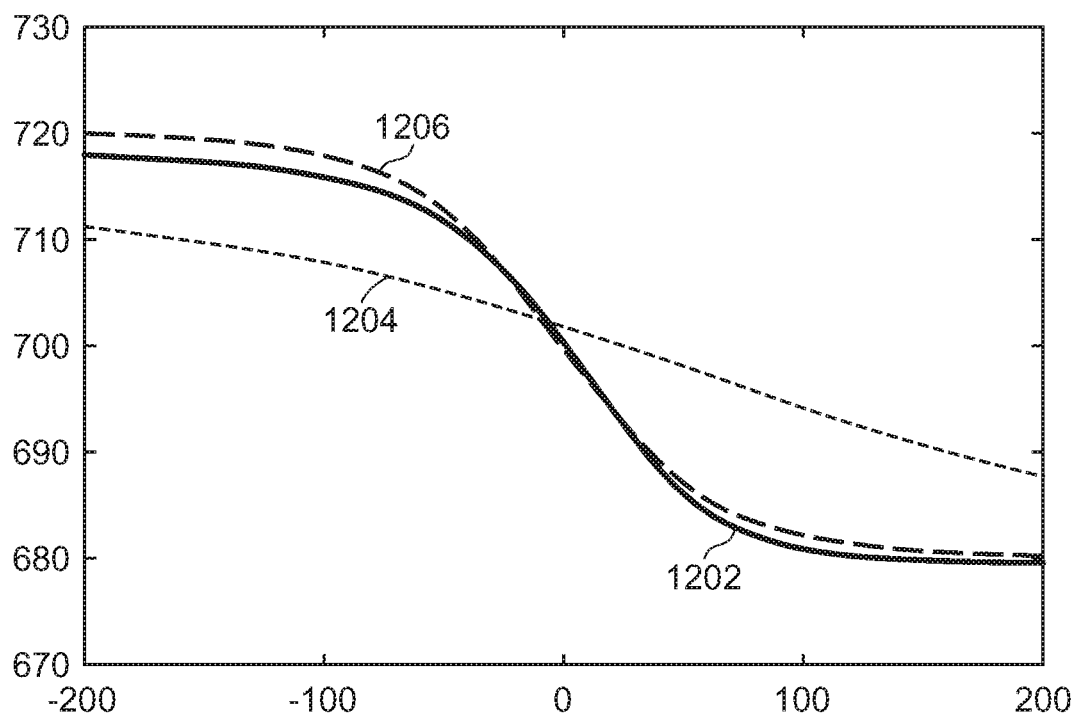
FIG. 12 is a graph of double spin valve resistance.

Referring to FIG. 12, graph 1200 illustrates sensitivity of double spin valves in various arrangements. The horizontal axis of graph 1200 represents magnetic field strength of an applied field. The vertical axis represents resistance of the double spin valve.

Curve 1202 illustrates the resistive reaction of a double spin valve with intrinsic bias 1108 & 1110 operating in an environment without an external static field. Curve 1202 is a close-to-ideal reaction for a double spin valve. When the magnetic field is opposite to the bias, the resistance of the double spin valve is high—720 Ohms in this example. When the magnetic field is parallel to the bias, the resistance of the spin valve is low—680 Ohms in this example.

Curve 1204 illustrates the resistive reaction of a double spin valve with biases 1108 & 1110 operating in an environment where an external, static field (e.g. the static field represented by magnetic vector 1102) is present. In this example, the external, static field interferes with the double spin valve's ability to detect the applied field. When the external field (i.e. the magnetic field to be detected by spin valve 900) changes polarity at point 0 on the horizontal axis, there is little change in the resistance of the spin valve.

Curve 1206 illustrates the resistive reaction of a biased double spin valve with biases 1104 & 1105 (e.g. double spin valve 900) operating in the presence of an external, static field. As shown, the performance curve 1206 of double spin valve 900 with bias magnetic vector 1104 and 1105 operating an environment with an external, static field vector 1102 approximates the performance curve 1202 of a double spin valve with biases 1108 & 1110 operating in an environment without an external, static field.

Figure 13:
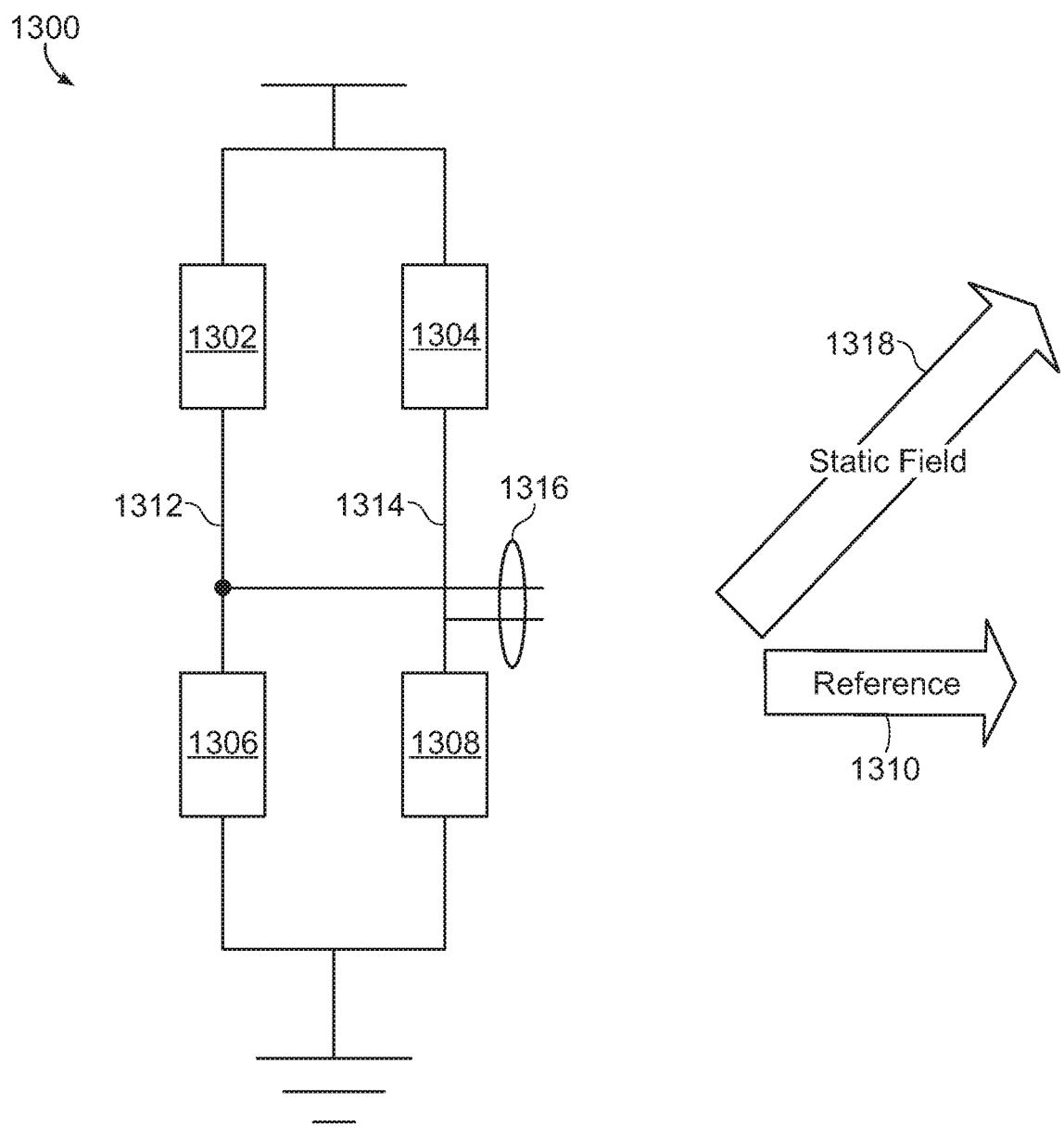
FIG. 13 is a circuit diagram of a bridge circuit using spin valves.

Referring to FIG. 13, circuit 1300 may comprise a plurality of spin valves 1302-1308 arranged in a bridge configuration configured to detect a magnetic field. Spin valves 1302-1308 may be configured and/or positioned so that, as reference magnetic field 1310 changes, the resistance of spin valves 1302 and 1308 increases while the resistance of spin valves 1304 and 1306 decreases, or vice versa. Thus, voltage nodes 1312 and 1314 may produce a differential signal 1316 representing reference field 1310.

In embodiments, all spin valves 1302-1308 may be configured to have the same reference direction (e.g. axes of maximum sensitivity). In other embodiments, spin valves 1302-1308 may be configured to have different reference directions (i.e. axes of maximum sensitivity).

In embodiments, circuit 1300 may operate in the presence of an external, static field 1318. To compensate for static field 1318, one or more of spin valves 1302-1308 may be a biased spin valve (e.g. spin valve 100), a double-pinned spin valve (e.g. spin valve 500), or a biased double spin valve (e.g. spin valve 900). The intrinsic magnetic bias of spin valves 1302-1308 may counter the effects of the static field 1318, allowing the spin valves 1302-1308 to maintain sufficient sensitivity to detect (and detect changes to) magnetic field 1310.

Examples of types of spin valves that can accept a magnetic bias, as described above, may be found in U.S. patent application Ser. No. 14/529,564 (filed Oct. 31, 2014), which is incorporated by reference here in its entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited in this document are incorporated here by reference in their entirety.

The invention claimed is:

1. A magnetoresistance element for detecting a changing magnetic field in an environment having a static magnetic field having a magnitude and a direction, the magnetoresistance element comprising:
   a first double-pinned spin valve comprising:
      a first pinning layer;
      a first pinned layer adjacent to the first pinning layer;
      a first spacer layer adjacent to the first pinned layer;
      a free layer adjacent to the first spacer layer and arranged so that the first spacer layer is between the first pinned layer and the free layer;
      a second pinning layer;
      a second pinned layer adjacent to the second pinning layer;
      a second spacer layer adjacent to the second pinned layer and the free layer; and
   a second double-pinned spin valve, wherein the second pinning layer is a shared layer between the first double-pinned spin valve and the second double-pinned spin valve,
   wherein the first spin valve has a bias with a magnitude and a direction, and
   wherein the static magnetic field is generated external to the magnetoresistance element,
   wherein the static magnetic field is defined by a first magnetic vector, the bias of the first spin valve is defined by a second magnetic vector, and a bias of the second double-pinned spin valve is defined by a third magnetic vector, and wherein a sum of the first and second magnetic vectors results in a first effective bias vector associated with the first double-pinned spin valve and a sum of the first and third magnetic vectors results in a second effective bias vector associated with the second double-pinned spin valve.

2. The magnetoresistance element of claim 1 wherein the first and second effective bias vectors have substantially opposite directions.

3. The magnetoresistance element of claim 1 wherein a direction of the first effective bias vector is substantially opposite to a direction of the first magnetic vector of the static magnetic field and a direction of the second bias vector is substantially the same as the direction of the first magnetic vector of the static magnetic field.

4. The magnetoresistance element of claim 1 wherein an axis of maximum sensitivity of the magnetoresistance element is positioned to detect the changing magnetic field.

5. The magnetoresistance element of claim 1 wherein the free layer comprises a ferromagnetic layer.

* * * * *

UNITED STATES PATENT AND TRADEMARK OFFICE
CERTIFICATE OF CORRECTION

PATENT NO. : 10,777,345 B2  
APPLICATION NO. : 15/901301  
DATED : September 15, 2020  
INVENTOR(S) : Rémy Lassalle-Balier et al.

Page 1 of 1

It is certified that error appears in the above-identified patent and that said Letters Patent is hereby corrected as shown below:

In the Specification

Column 4, Lines 19-22, delete "504, a spacer layer 506, a free layer 508, a coupling spacer layer 510, a second pinned layer 512, and a second pinning layer 514".

Column 4, Line 67, delete "either other" and replace with --each other--.

Column 5, Line 12, delete "layer The" and replace with --layer. The--.

Column 7, Line 12, delete "magnetic bias magnetic vector" and replace with --magnetic bias vector--.

Column 7, Line 38, delete "layer 908 and 920" and replace with --layers 908 and 920--.

Column 8, Line 24, delete "magnet field." and replace with --magnetic field.--.

Column 8, Line 39, delete "$H_B1+H_S=H_{E1}$," and replace with --$H_{B1}+H_S=H_{E1}$,--.

Column 9, Line 16, delete "vector 1104 and 1105" and replace with --vectors 1104 and 1105--.

Column 9, Line 54, delete "that that" and replace with --that the--.

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*